(12) United States Patent
Quan

(10) Patent No.: US 10,862,063 B2
(45) Date of Patent: Dec. 8, 2020

(54) ELECTROLUMINESCENT DEVICE, DISPLAY PANEL AND DISPLAY APPARATUS

(71) Applicant: BOE TECHNOLOGY GROUP CO., LTD., Beijing (CN)

(72) Inventor: Wei Quan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/434,070

(22) Filed: Jun. 6, 2019

(65) Prior Publication Data
US 2020/0075881 A1 Mar. 5, 2020

(30) Foreign Application Priority Data
Aug. 31, 2018 (CN) .......................... 2018 1 1012798

(51) Int. Cl.
*H01L 27/32* (2006.01)
*H01L 51/52* (2006.01)
*H04N 9/31* (2006.01)

(52) U.S. Cl.
CPC ...... *H01L 51/5206* (2013.01); *H01L 27/3209* (2013.01); *H01L 51/5221* (2013.01); *H04N 9/31* (2013.01)

(58) Field of Classification Search
CPC ............. H01L 51/5221; H01L 27/3209; H01L 51/5206; H04N 9/31
See application file for complete search history.

(56) References Cited

U.S. PATENT DOCUMENTS

| 7,714,504 | B2 | 5/2010 | Forrest et al. |
| 8,304,977 | B2 | 11/2012 | Oda |
| 2008/0018239 | A1* | 1/2008 | Matsuda ................ C09K 11/06 313/504 |
| 2013/0153871 | A1* | 6/2013 | Ma ........................ H01L 51/504 257/40 |

(Continued)

FOREIGN PATENT DOCUMENTS

| CN | 1215500 A | 4/1999 |
| CN | 102054936 A | 5/2011 |

(Continued)

OTHER PUBLICATIONS

First Chinese Office Action dated Dec. 24, 2019, for corresponding Chinese Application No. 201811012798.6.

*Primary Examiner* — Towfiq Elahi
(74) *Attorney, Agent, or Firm* — Kinney & Lange, P.A.

(57) ABSTRACT

An electroluminescent device, a display panel and a display apparatus are disclosed. The electroluminescent device includes: a substrate; an anode on the substrate; a luminescent layer on a side of the anode facing away from the substrate; and a cathode on a side of the luminescent layer facing away from the substrate. The cathode includes a transflective layer on the side of the luminescent layer facing away from the substrate; and a light-emission enhancement layer on a side of the transflective layer facing away from the substrate. The anode is configured to reflect light incident thereon, a material of the transflective layer includes metal, and the transflective layer is configured to transmit a first portion of light incident thereon and to reflect a second portion of the light incident thereon.

14 Claims, 6 Drawing Sheets

(56) References Cited

U.S. PATENT DOCUMENTS

| | | | |
|---|---|---|---|
| 2015/0349284 A1* | 12/2015 | Seo | H01L 51/5024 |
| | | | 257/40 |
| 2018/0175298 A1* | 6/2018 | Sassa | H01L 29/786 |
| 2018/0233693 A1 | 8/2018 | Li | |
| 2019/0334108 A1* | 10/2019 | Shin | H01L 51/5012 |

FOREIGN PATENT DOCUMENTS

| | | |
|---|---|---|
| CN | 106098955 A | 11/2016 |
| JP | 2006216336 A | 8/2006 |

* cited by examiner

US 10,862,063 B2

ELECTROLUMINESCENT DEVICE, DISPLAY PANEL AND DISPLAY APPARATUS

CROSS-REFERENCE TO RELATED APPLICATION

This application claims the benefit of Chinese Patent Application No. 201811012798.6 filed on Aug. 31, 2018 in the State Intellectual Property Office of China, the whole disclosure of which is incorporated herein by reference.

TECHNICAL FIELD

The present disclosure relates to the field of display technologies, and in particular, to an electroluminescent device, a display panel and a display apparatus.

BACKGROUND

Organic light emitting diode (abbreviated as OLED) devices have many advantages such as active illumination, high brightness, high contrast, ultra-thin characteristic, low power consumption, flexibility and wide operating temperature range, so that they have become an extremely competitive and most promising technology in next-generation display technologies.

Due to factors such as the manufacturing process, a manufactured organic electroluminescent device is usually subjected to a situation in which light emitted therefrom of a certain color does not meet an actual requirement. For example, actually required color is dark blue, but the light emitted from the manufactured organic electroluminescent device is light blue, so that the light emitted from the organic electroluminescent device does not meet the requirement, thereby affecting display effect adversely.

SUMMARY

In an aspect, an electroluminescent device is provided including: a substrate; an anode on the substrate; a luminescent layer on a side of the anode facing away from the substrate; and a cathode on a side of the luminescent layer facing away from the substrate, the cathode including: a transflective layer on the side of the luminescent layer facing away from the substrate; and a light-emission enhancement layer on a side of the transflective layer facing away from the substrate, wherein the anode is configured to reflect light incident thereon, a material of the transflective layer includes metal, and the transflective layer is configured to transmit a first portion of light incident thereon and to reflect a second portion of the light incident thereon.

Optionally, the material of the transflective layer includes a magnesium-silver alloy.

Optionally, a thickness of the light-emission enhancement layer is related to a material of the luminescent layer.

Optionally, the luminescent layer is a luminescent layer that emits red light, and the thickness of the light-emission enhancement layer is in a range of 110 nm to 120 nm. Alternatively or additionally, the luminescent layer is a luminescent layer that emits green light, and the thickness of the light-emission enhancement layer is in a range of 90 nm to 100 nm. Alternatively or additionally, the luminescent layer is a luminescent layer that emits blue light, and the thickness of the light-emission enhancement layer is in a range of 80 nm to 90 nm.

Optionally, a material of the light-emission enhancement layer includes a transparent oxide.

Optionally, the transflective layer has a thickness greater than 8 nm.

Optionally, the cathode further includes an electrode layer between the transflective layer and the light-emission enhancement layer.

Optionally, an orthographic projection of each of the anode, the transflective layer and the light-emission enhancement layer on the substrate covers an orthographic projection of the luminescent layer on the substrate.

Optionally, a thickness of the electrode layer is determined according to a design resistance value of the cathode, a thickness of the transflective layer, and a thickness of the light-emission enhancement layer.

Optionally, the electrode layer includes the same material as the light-emission enhancement layer.

Optionally, a material of the electrode layer includes a transparent oxide.

Optionally, the anode includes: a conductive anode layer on the substrate; and a reflective layer between the conductive anode layer and the substrate.

Optionally, a material of the reflective layer includes silver.

Optionally, the luminescent layer includes an organic electroluminescent material.

In another aspect, a display panel is further provided including the electroluminescent device as described above.

In a further aspect, a display apparatus is further provided including the display panel as described above.

DETAILED DESCRIPTION OF EMBODIMENTS

In order to make objectives, characteristics and advantages of the present disclosure become more apparent, the present disclosure will be described in detail in conjunction with the accompanying drawings and specific embodiments.

Figure 1:
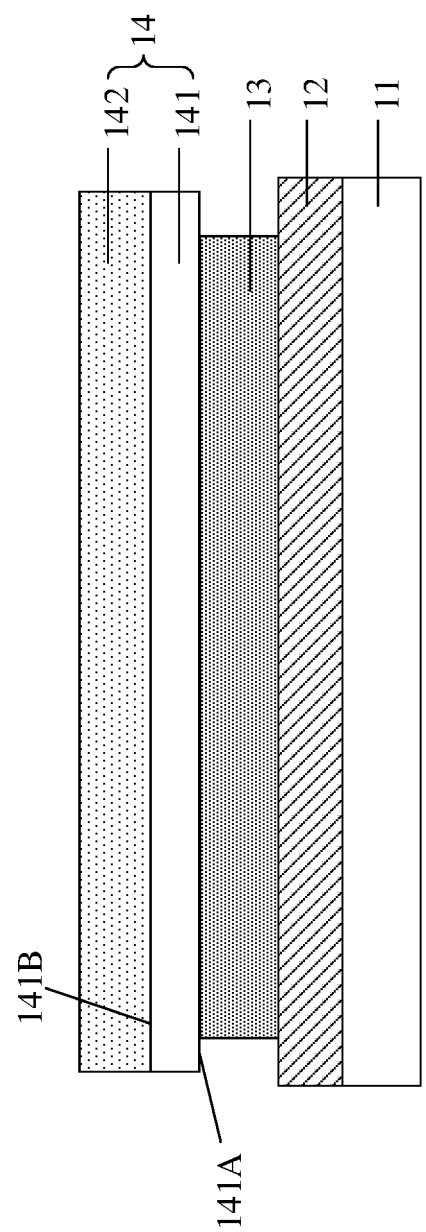
FIG. 1 is a schematic structural view of an organic electroluminescent device according to some embodiments of the present disclosure.

Referring to FIG. 1, a schematic structural view of an organic electroluminescent device according to some embodiments of the present disclosure is shown. The organic electroluminescent device according to some embodiments of the present disclosure includes a substrate 11, an anode 12, a luminescent layer 13, and a cathode 14 which are sequentially formed on the substrate 11. The cathode 14 includes a transflective layer 141 and a light-emission enhancement layer 142 which are sequentially formed on the luminescent layer 13. In other words, the luminescent layer 13 is disposed on a side of the anode 12 facing away from the substrate 11, the transflective layer 141 is disposed on a side of the luminescent layer 13 facing away from the substrate 11, and the light-emission enhancement layer 142 is disposed on a side of the transflective layer 141 facing away from the substrate 11.

Figure 2:
FIG. 2 is a schematic structural view of a luminescent layer of an organic electroluminescent device.

For example, referring to FIG. 2, the luminescent layer 13 may include a plurality of functional layers such as a hole injection layer 134, a hole transport layer 135, an organic luminescent material layer 136, an electron transport layer 137, and an electron injection layer 138. When a voltage applied between the anode and the cathode of the organic electroluminescent device is greater than a threshold voltage of the device, holes are injected into the organic luminescent material layer from the anode through the hole injection layer and the hole transport layer, meanwhile, electrons are injected into the organic luminescent material layer from the cathode through the electron injection layer and the electron transport layer. In the organic luminescent material layer, electrons and holes meet to form excitons under Coulomb force. The excitons have energy and are typically unstable, so that they release energy in the form of light energy, thereby emitting light. It should be noted that, depending on the energy of the excitons, photons of different energies may be emitted so as to emit light of different colors.

Herein, the transflective layer 141 may be understood as transmitting a portion of light incident thereon and reflecting the other portion of the light incident thereon. For example, an amount of the transmitted portion of the light incident on the transflective layer 141 is equal to an amount of the reflected portion of the light incident on the transflective layer 141, that is, about a half of the light incident on the transflective layer 141 is transmitted through the transflective layer 141 while the other half of the light incident on the transflective layer 141 is reflected by the transflective layer 141. In the embodiment, the transflective layer 141 may transmit a portion of light which is emitted from the luminescent layer 13 and incident on the transflective layer 141 and reflect the other portion of the light which is emitted from the luminescent layer 13 and incident on the transflective layer 141. For example, about 50% of the light which is emitted from the luminescent layer 13 and incident on the transflective layer 141 is transmitted through the transflective layer 141 and about 50% of the light which is emitted from the luminescent layer 13 and incident on the transflective layer 141 is reflected by the transflective layer 141.

For example, the transflective layer 141 may have a thickness greater than 8 nm to achieve a better transflective effect. Through a lot of experiments, the inventors have found that when the thickness of the transflective layer 141 is less than 8 nm, most of the light which is emitted from the luminescent layer 13 and incident on the transflective layer 141 is transmitted through the transflective layer 141, so that it is disadvantageous to achieve a transflective effect.

Figure 3:
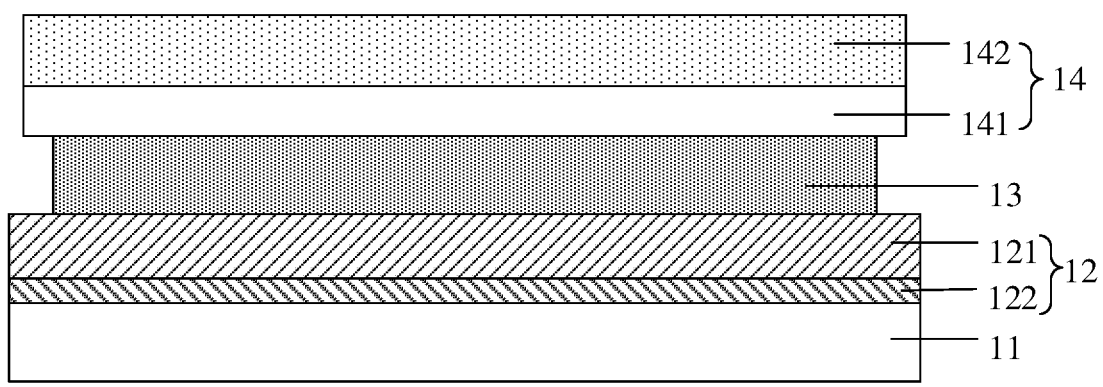
FIG. 3 is a schematic structural view of an organic electroluminescent device according to some embodiments of the present disclosure.

Referring again to FIG. 1, the anode 12 may be of reflective so as to reflect light incident thereon, for example, to reflect light which is emitted from the luminescent layer 13 and incident on the anode. The anode 12 is capable of reflecting almost all of the light incident thereon. For example, the anode 12 itself may be a reflective anode. For another example, referring to FIG. 3, the anode 12 may further include a conductive anode layer 121 and a reflective layer 122. For example, the conductive anode layer 121 may be composed of a transparent oxide such as indium tin oxide (ITO) or indium zinc oxide (IZO), and the reflective layer 122 may be composed of metal such as silver.

As shown in FIG. 1, an orthographic projection of the anode 12 on the substrate 11 covers an orthographic projection of the luminescent layer 13 on the substrate 11, and an orthographic projection of the transflective layer 141 on the substrate 11 covers the orthographic projection of the luminescent layer 13 on the substrate 11. When a voltage is applied between the anode 12 and the cathode 14 so that the luminescent layer 13 emits light, since the luminescent layer 13 is located between the transflective layer 141 and the anode 12, almost all of light is reflected back by the anode 12 when the light is emitted from the luminescent layer 13 and incident on the anode 12, and about 50% of light is reflected back by the transflective layer 141 when the light is emitted from the luminescent layer 13 and incident on the transflective layer 141. As a result, a microcavity is formed between the transflective layer 141 and the anode 12. The light emitted from the luminescent layer 13 may interfere with each other in the microcavity through refraction and reflection, thereby generating a microcavity resonance effect. In this way, a portion, at a specific wavelength, of the light emitted from the luminescent layer 13 is emitted out, thereby narrowing an emission spectrum and enhancing a luminous intensity of light at the specific wavelength.

Further, in the embodiment of the present disclosure, the transflective layer 141 is composed of metal material, so that surface plasmons are generated when the light emitted from the luminescent layer 13 is incident on the transflective layer 141. The so-called surface plasmons (SPs) refer to an electromagnetic wave which is generated under an interaction between electrons vibrating free on a metal surface and photons and propagates along the metal surface. Typically, the electromagnetic wave has the largest field strength at an interface between a metal and a medium, and the field strength of the electromagnetic wave exponentially decays in a direction perpendicular to the interface. For example, in the organic electroluminescent device provided by the above embodiments, the generated excitons interact with a metal electrode (e.g., the transflective layer 141) so as to generate the surface plasmons.

For example, a material of the transflective layer 141 may include a magnesium-silver alloy so as to achieve both a transflective effect and a surface plasmon effect. The light-emission enhancement layer 142 may be composed of a transparent oxide such as indium tin oxide (ITO) or indium zinc oxide (IZO).

Specifically, the excitons in the luminescent layer 13 may couple energy to an upper interface and a lower interface of the cathode metal (e.g., the transflective layer 141). Referring to FIG. 1, the upper interface and the lower interface herein may be a first interface 141A of the transflective layer 141 facing towards the luminescent layer 13 and a second interface 141B of the transflective layer 141 facing away from the luminescent layer 13, respectively. By modeling an exciton radiation as electric dipole radiation, the inventors have found through research that the surface plasmon loss at the first interface 141A is large, so that it is disadvantageous for the light emitted from the luminescent layer 13 to be emitted through the transflective layer 141. In the embodiments of the present disclosure, the light-emission enhancement layer 142 is disposed on a side of the transflective layer 141 facing away from the luminescent layer 13, so that two medium layers, i.e., the luminescent layer 13 and the light-emission enhancement layer 142, are respectively disposed on both sides of the transflective layer 141. When effective refractive indices of the medium layers on both sides of the transflective layer 141 match with each other, the surface plasmon effects at the two interfaces are coupled to each other, so that an electric field of the surface plasmons is capable of passing through the transflective layer 141.

Therefore, in the embodiments of the present disclosure, by designing a thickness of the light-emission enhancement layer 142, the effective refractive indices of the medium layers on both sides of the transflective layer 141 are better matched, so that the surface plasmon effects at the two interfaces are mutually coupled to the maximum extent. In this way, the light at the specific wavelength which is transmitted through the transflective layer 141 may be further narrowed, and the luminous intensity of the light at the specific wavelength may be further enhanced.

In the embodiments of the present disclosure, a first microcavity is formed between the transflective layer 141 and the reflective anode 12, and a portion, at the specific wavelength, of light emitted from the luminescent layer 13 is emitted out under the microcavity resonance effect, thereby narrowing the emission spectrum and enhancing the luminous intensity of the light at the specific wavelength. Further, by providing the light-emission enhancement layer 142 on the metal transflective layer 141, the light at the specific wavelength transmitted through the transflective layer 141 may be further narrowed and the luminous intensity of the light at the specific wavelength may be further enhanced by using the energy coupling of the surface plasmons. Therefore, the light-emission enhancement layer 142 may achieve an effect similar to a second microcavity.

For example, the anode 12 may be formed on the substrate 11 by a sputtering process, the luminescent layer 13 may be formed on the anode 12 by a process such as vacuum evaporation or printing, the transflective layer 141 may be formed on the luminescent layer 13 by an evaporation process, and the light-emission enhancement layer 142 may be formed on the transflective layer 141 by a sputtering process.

Figure 4:
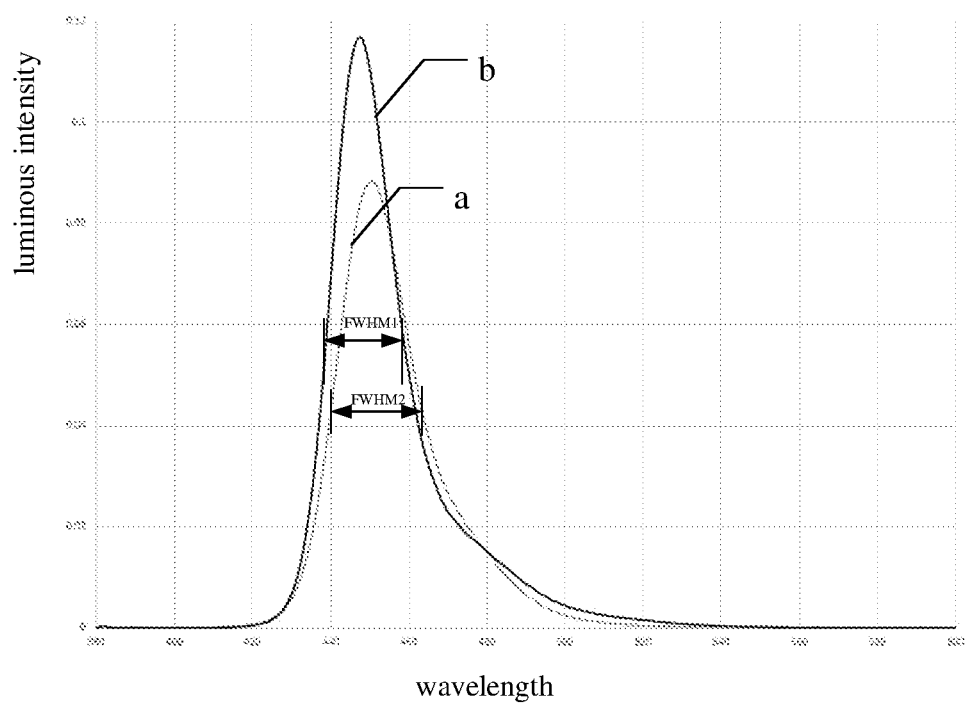
FIG. 4 is a spectrogram of light emitted from the organic electroluminescent device according to some embodiments of the present disclosure.

Referring to FIG. 4, a spectrogram of light emitted from the organic electroluminescent device according to some embodiments of the present disclosure is illustrated.

In FIG. 4, the abscissa represents the wavelength of light emitted from the organic electroluminescent device, the ordinate represents the luminous intensity of the light emitted from the organic electroluminescent device, curve a represents a spectrogram of light emitted from an organic electroluminescent device in the related art, and curve b represents a spectrogram of light emitted from the organic electroluminescent device according to some embodiments of the present disclosure. It can be seen that the full width at half maximum (abbreviated as FWHM) of the light emitted from the organic electroluminescent device according to the embodiments of the present disclosure has a narrower wavelength range, as shown in FIG. 4, FWHM1<FWHM2. Also, the light emitted from the organic electroluminescent device according to the embodiments of the present disclosure has a larger luminous intensity. In other words, with the organic electroluminescent device according to the embodiments of the present disclosure, it is possible to narrow the light at the specific wavelength and enhance the luminous intensity of light at the specific wavelength, so that the color gamut may be improved, and the light emitted from the organic electroluminescent device may meet an actual requirement.

Figure 5:
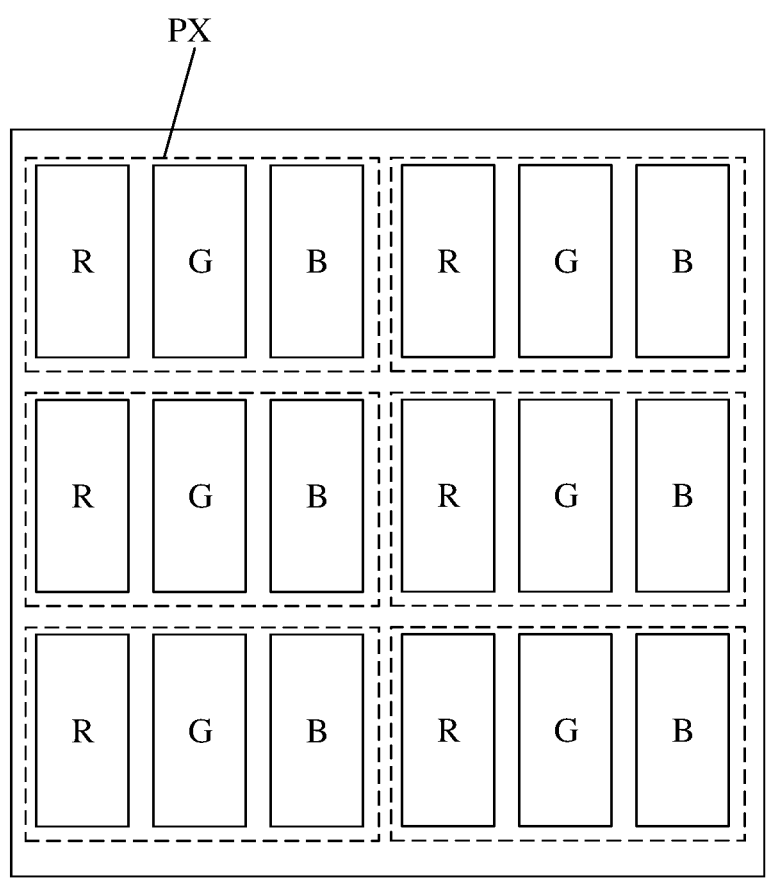
FIG. 5 is a plan view of an electroluminescent display panel according to some embodiments of the present disclosure.

FIG. 5 is a plan view of an electroluminescent display panel according to some embodiments of the present disclosure. As shown in FIG. 5, the electroluminescent display panel may include a plurality of pixels PX, each of which may include a plurality of sub-pixels, for example, one pixel may include a red sub-pixel R, a green sub-pixel G, and a blue sub-pixel B.

Figure 6:
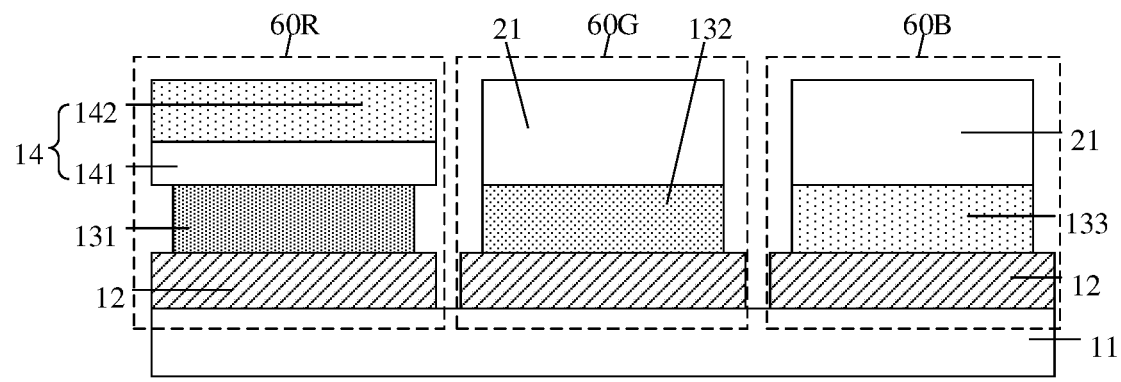
FIGS. 6-8 are schematic structural views of organic electroluminescent devices in a pixel according to some embodiments of the present disclosure.
Figure 7:
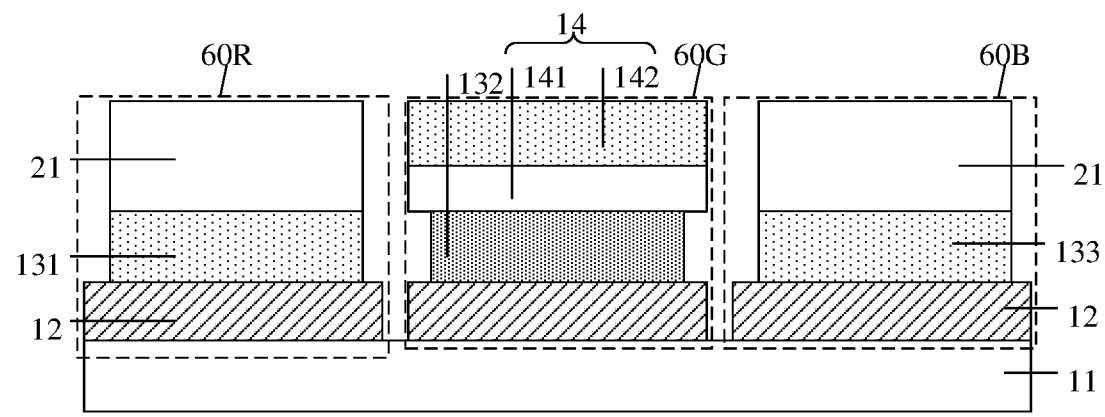
Figure 8:
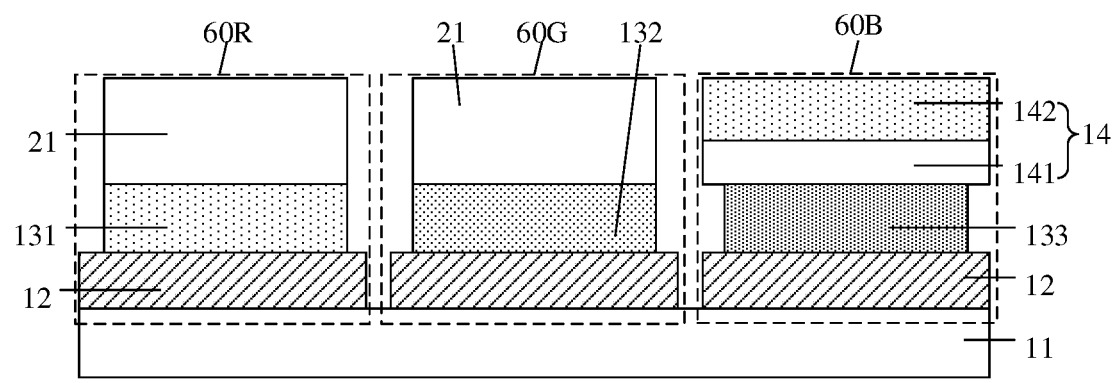

FIGS. 6-8 are schematic structural views of organic electroluminescent devices in a pixel according to some embodiments of the present disclosure. As shown in FIGS. 6-8, an organic electroluminescent device may be disposed in each sub-pixel, that is, the red sub-pixel R, the green sub-pixel G, and the blue sub-pixel B are respectively provided with an organic electroluminescent device 60R that emits red light, an organic electroluminescent device 60G that emits green light, and an organic electroluminescent device 60B that emits blue light.

Due to factors such as the actual manufacturing process, it may happen that the color of light emitted from one of the organic electroluminescent devices 60R, 60G, and 60B does not meet the actual requirement. In this case, even if thicknesses of both the anode 12 and the luminescent layer 13 of the organic electroluminescent device cannot be adjusted, the cathode 14 may be adjusted to narrow the emission spectrum and enhance the luminous intensity of the light at the specific wavelength, so that the light emitted through the cathode 14 meets the actual requirement, thereby improving the display effect.

Referring to FIG. 6, the organic electroluminescent device 60R which emits red light may adopt the structure described in the embodiments of the present disclosure. Specifically, the organic electroluminescent device 60R may include an anode 12, a luminescent layer 131 for emitting red light, and a cathode 14 which are sequentially formed on the substrate 11, and the cathode 14 includes the transflective layer 141 and the light-emission enhancement layer 142 which are sequentially formed on the luminescent layer 131. An orthographic projection of each of the anode 12, the transflective layer 141, and the light-emission enhancement layer 142 on the substrate 11 covers an orthographic projection of the luminescent layer 131 on the substrate 11. As described above, the first microcavity is formed between the anode 12 and the transflective layer 141, and a portion, at the specific wavelength, of light emitted from the luminescent layer 131 is emitted out under the microcavity resonance effect, so as to narrow the emission spectrum and enhance the luminous intensity of light at the specific wavelength, that is, to narrow the spectrum of the emitted red light and enhance the luminous intensity of the red light.

Further, since materials of the luminescent layers for emitting red light, green light, and blue light are different, the thicknesses of the light-emission enhancement layers 142 in the organic electroluminescent devices that emits different colors need to be designed differently so as to achieve matching of effective refractive indices. That is to say, the thickness of the light-emission enhancement layer 142 is related to the material of the luminescent layer, so that it is necessary to design the thickness of the light-emission enhancement layer 142 according to the material of the luminescent layer. In the embodiments, the thickness of the light-emission enhancement layer 142 is designed to be in a range of 110 nm to 120 nm, so that the effective refractive indices of the luminescent layer 131 for emitting red light and the light-emission enhancement layer 142 on both sides of the transflective layer 141 are better matched with each other, so that it is possible to further narrow the red light transmitted through the transflective layer 141 and further enhance the luminous intensity of the red light.

For example, the organic electroluminescent device 60G that emits green light may include an anode 12, a luminescent layer 132 for emitting green light, and a cathode 21 which are sequentially formed on the substrate 11. The organic electroluminescent device 60B that emits blue light may include an anode 12, a luminescent layer 133 for emitting blue light, and a cathode 21 which are sequentially formed on the substrate 11. For example, the cathode 21 may be a transparent cathode composed of a transparent oxide such as indium tin oxide (ITO) or indium zinc oxide (IZO). The anode 12 is still a reflective anode. The light emitted from the luminescent layers 132 and 133 is transmitted through the transparent cathode 21 to be emitted out.

Similarly, referring to FIG. 7, the organic electroluminescent device 60G that emits green light may adopt the structure described in the embodiments of the present disclosure. Specifically, the organic electroluminescent device 60G may include an anode 12, a luminescent layer 132 for emitting green light, and a cathode 14 which are sequentially formed on the substrate 11, and the cathode 14 includes a transflective layer 141 and a light-emission enhancement layer 142 which are sequentially formed on the luminescent layer 132. The orthographic projection of each of the anode 12, the transflective layer 141, and the light-emission enhancement layer 142 on the substrate 11 covers the orthographic projection of the luminescent layer 132 on the substrate 11. As described above, the first microcavity is formed between the anode 12 and the transflective layer 141, and a portion, at the specific wavelength, of light emitted from the luminescent layer 132 is emitted out under the microcavity resonance effect, so as to narrow the emission spectrum and enhance the luminous intensity of light at the specific wavelength, that is, to narrow the spectrum of the emitted green light and enhance the luminous intensity of the green light.

Further, in the embodiments, the thickness of the light-emission enhancement layer 142 is designed to be in a range of 90 nm to 100 nm, so that the effective refractive indices of the luminescent layer 132 for emitting green light and the light-emission enhancement layer 142 on both sides of the transflective layer 141 are better matched with each other, so that it is possible to further narrow the green light transmitted through the transflective layer 141 and further enhance the luminous intensity of the green light.

Similarly, referring to FIG. 8, the organic electroluminescent device 60B that emits blue light may adopt the structure described in the embodiments of the present disclosure. Specifically, the organic electroluminescent device 60B may include an anode 12, a luminescent layer 133 for emitting blue light, and a cathode 14 which are sequentially formed on the substrate 11, and the cathode 14 includes a transflective layer 141 and a light-emission enhancement layer 142 which are sequentially formed on the luminescent layer 133. The orthographic projection of each of the anode 12, the transflective layer 141, and the light-emission enhancement layer 142 on the substrate 11 covers the orthographic projection of the luminescent layer 133 on the substrate 11. As described above, the first microcavity is formed between the anode 12 and the transflective layer 141, and a portion, at the specific wavelength, of light emitted from the luminescent layer 133 is emitted out under the microcavity resonance effect, so as to narrow the emission spectrum and enhance the luminous intensity of light at the specific wavelength, that is, to narrow the spectrum of the emitted blue light and enhance the luminous intensity of the blue light.

Further, in the embodiments, the thickness of the light-emission enhancement layer 142 is designed to be in a range of 80 nm to 90 nm, so that the effective refractive indices of the luminescent layer 133 for emitting blue light and the light-emission enhancement layer 142 on both sides of the transflective layer 141 are better matched with each other, so that it is possible to further narrow the blue light transmitted through the transflective layer 141 and further enhance the luminous intensity of the blue light.

For example, in an actual manufacturing process, it is first determined which color of light in a pixel needs to be improved. As shown in FIG. 6, when the red light in the pixel needs to be improved, the transflective layer 141 and the light-emission enhancement layer 142 are sequentially formed on the luminescent layer 131 for emitting red light, and the thickness of the light-emission enhancement layer 142 is in a range of 110 nm to 120 nm, so that the luminous intensity of the red light emitted from the luminescent layer 131 is improved. Also, each of the luminescent layer 132 for emitting green light and the luminescent layer 133 for emitting blue light may merely adopt the structure of the cathode 21. As shown in FIG. 7, when the green light in the pixel needs to be improved, the transflective layer 141 and the light-emission enhancement layer 142 are sequentially formed on the luminescent layer 132 for emitting green light, and the thickness of the light-emission enhancement layer 142 is in a range of 90 nm to 100 nm, so that the luminous intensity of the green light emitted from the luminescent layer 132 is improved. Also, each of the luminescent layer 131 for emitting red light and the luminescent layer 133 for emitting blue light may merely adopt the structure of the cathode 21. As shown in FIG. 8, when the blue light in the pixel needs to be improved, the transflective layer 141 and the light-emission enhancement layer 142 are sequentially formed on the luminescent layer 133 for emitting blue light, and the thickness of the light-emission enhancement layer 142 is in a range of 80 nm to 90 nm, so that the luminous intensity of the blue light emitted from the luminescent layer 133 is improved. Also, each of the luminescent layer 131 for emitting red light and the luminescent layer 132 for emitting green light may merely adopt the structure of the cathode 21.

In the embodiments of the present disclosure, by sequentially forming the transflective layer 141 and the light-emission enhancement layer 142 on the luminescent layer 133 for emitting blue light, the wavelength range of the blue light emitted from the luminescent layer 133 for emitting blue light is narrowed, and the luminous intensity of the blue light is enhanced, thereby increasing the color gamut. In this way, the blue light emitted from the organic electroluminescent device may meet the actual requirement. For example, the actual required color is dark blue, if the cathode 21 is formed directly on the luminescent layer 133 for emitting blue light, then the emitted blue light has a wide wavelength range and the luminous intensity is small, so that the actually emitted blue light is light blue, which is not consistent with the actually required color. By using the cathode structure according to the embodiments of the present disclosure, the wavelength range of the emitted blue light is narrowed, and the luminous intensity of the blue light is enhanced, so that the actually emitted blue light is dark blue, which is consistent with the actual requirement.

Correspondingly, by sequentially forming the transflective layer 141 and the light-emission enhancement layer 142 on the luminescent layer 131 for emitting red light, the wavelength range of the red light emitted from the luminescent layer 131 for emitting red light is narrowed, and the luminous intensity of the red light is enhanced, thereby increasing the color gamut. In this way, the red light emitted from the organic electroluminescent device may meet the actual requirement. By sequentially forming the transflective layer 141 and the light-emission enhancement layer 142 on the luminescent layer 132 for emitting green light, the wavelength range of the green light emitted from the luminescent layer 132 for emitting green light is narrowed, and the luminous intensity of the green light is enhanced, thereby increasing the color gamut. In this way, the green light emitted from the organic electroluminescent device may meet the actual requirement.

Figure 9:
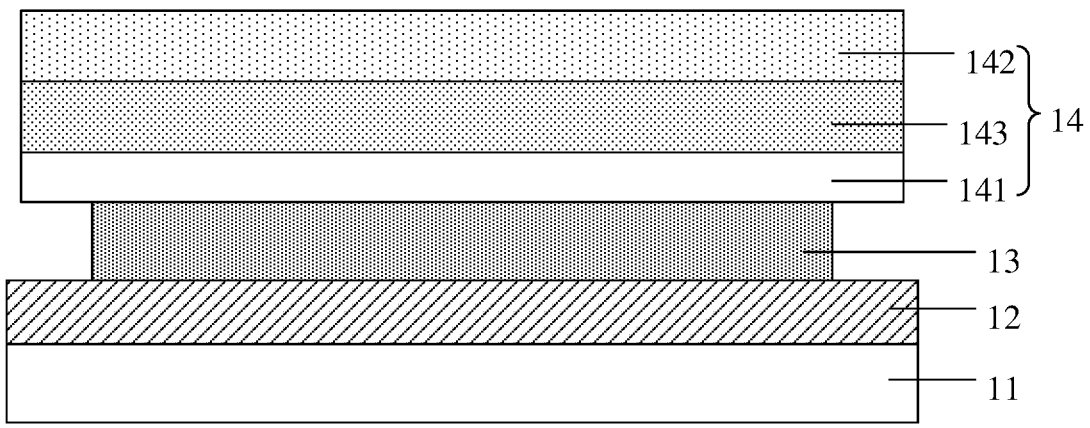
FIG. 9 is a schematic structural view of an organic electroluminescent device according to some embodiments of the present disclosure.

Referring to FIG. 9, a schematic structural view of an organic electroluminescent device according to some embodiments of the present disclosure is illustrated. As shown in FIG. 9, the organic electroluminescent device may include a substrate 11, an anode 12, a luminescent layer 13, and a cathode 14 which are sequentially formed on the substrate 11, and the cathode 14 includes a transflective layer 141, an electrode layer 143, and a light-emission enhancement layer 142 which are sequentially formed on the luminescent layer 13. The electrode layer 143 is located between the transflective layer 141 and the light-emission enhancement layer 142. The electrode layer 143 may be composed of the same material as the light-emission enhancement layer 142. For example, the material of the electrode layer 143 may also include the transparent oxide such as indium tin oxide or indium zinc oxide. Thus, the electrode layer 143 does not affect the surface plasmon effect described above, and it is also advantageous to manufacture the electrode layer.

For example, the thickness of the electrode layer 143 may be determined according to a design resistance value of the cathode as well as the thicknesses of both the transflective layer 141 and the light-emission enhancement layer 142. After the thicknesses of both the transflective layer 141 and the light-emission enhancement layer 142 are determined, the resistance values of both the transflective layer 141 and the light-emission enhancement layer 142 are obtained. By subtracting an actually required cathode resistance value from a sum of the resistance values of both the transflective layer 141 and the light-emission enhancement layer 142, a resistance value of the electrode layer 143 is obtained, so that the thickness of the electrode layer 143 is determined.

For example, the sum of the resistance values of both the transflective layer 141 and the light-emission enhancement layer 142 may be 7Ω, and the actually required cathode resistance value may be 5Ω, thus the resistance value of the electrode layer 143 is 2Ω. Further, the thickness of the electrode layer 143 is determined according to the resistance value of the electrode layer 143.

The electrode layer 143 is mainly used to adjust the resistance value of the cathode 14 such that the resistance value of the cathode 14 meets the display requirement. Moreover, by adding the electrode layer 143, the total thickness of the cathode 14 may be increased, so that the resistivity of the cathode may be lowered, and the problem of IR Drop occurring in a large-sized display apparatus may be prevented.

For example, the anode 12 may be formed on the substrate 11 by a sputtering process, the luminescent layer 13 may be formed on the anode 12 by a process such as vacuum evaporation or printing, the transflective layer 141 may be formed on the luminescent layer 13 by an evaporation process, the electrode layer 143 may be formed on the transflective layer 141 by a sputtering process, and then the light-emission enhancement layer 142 may be formed on the electrode layer 143 by a sputtering process.

It should be noted that the organic electroluminescent device in the embodiments of the present disclosure is a top emission organic electroluminescent device, and the light emitted from the luminescent layer 13 is emitted out through the cathode 14.

In the embodiments of the present disclosure, the anode, the luminescent layer, and the cathode are sequentially formed on the substrate, and the cathode includes the transflective layer and the light-emission enhancement layer which are sequentially formed on the luminescent layer. By forming the transflective layer on the luminescent layer, the microcavity resonance effect is generated between the anode and the transflective layer, so that a portion, at the specific wavelength, of light emitted from the luminescent layer is emitted out. By forming the light-emission enhancement layer on the transflective layer, the luminous intensity of the light at the specific wavelength is further enhanced. In this way, the light emitted from the organic electroluminescence device meets the requirement, thus the display effect is improved.

Referring back to FIGS. 5-8, embodiments of the present disclosure provide a display panel including the above-described organic electroluminescent device. For a detailed description of the organic electroluminescent device, references may be made to the above descriptions, and details are not described herein again.

Some embodiments of the present disclosure further provide a display apparatus including the above-described display panel, and the display panel may be a top emission OLED display panel. For example, the display apparatus may be any product or component having a display function, such as a mobile phone, a tablet computer, a television, a display, a notebook computer, a navigator, and the like.

In some embodiments of the present disclosure, the display panel includes an organic electroluminescence device, the anode, the luminescent layer, and the cathode are sequentially formed on the substrate, and the cathode includes the transflective layer and the light-emission enhancement layer which are sequentially formed on the luminescent layer. By forming the transflective layer on the luminescent layer, the microcavity resonance effect is generated between the anode and the transflective layer, so that a portion, at the specific wavelength, of light emitted from the luminescent layer is emitted out. By forming the light-emission enhancement layer on the transflective layer, the luminous intensity of the light at the specific wavelength is further enhanced. In this way, the light emitted from the organic electroluminescence device meets the requirement, thus the display effect is improved.

The embodiments of the present disclosure have been described by taking an OLED device as an example, but the embodiments of the present disclosure may also be applied to other types of electroluminescent devices, such as inorganic electroluminescent devices, quantum dot electroluminescent devices.

It should be noted that various embodiments herein are described in a progressive manner, and each embodiment is described by focusing on differences from other embodiments, and the same or similar parts between any two embodiments may be referred to each other.

It should also be noted that, relational terms such as first, second or the like are used merely to distinguish one entity or operation from another entity or operation, without necessarily requiring or implying these entities or operations have any such actual relationships or orders. Furthermore, terms "comprise", "comprising" or any other variations are intended to encompass a non-exclusive inclusion, such that a process, a method, an item or an apparatus comprising a series of elements not only includes these elements, but also includes other elements which are not clearly listed, also includes elements that are inherent to such a process, method, item, or apparatus. Unless otherwise stated, a phrase "comprising an element . . . " does not exclude the presence of additional equivalent elements in the process, method, item, or apparatus including the element.

The electroluminescent device, the display panel and the display apparatus provided by the present disclosure are described in detail above. The principles and implementations of the present disclosure are described herein by taking specific examples. The above embodiments are only used to help understand the present disclosure and the inventive concept thereof. Moreover, according to the concept of the present disclosure, there will be changes to the specific embodiments and application scopes for those skilled in the art. Therefore, the contents of the specification are not to be construed as limiting the present disclosure.

What is claimed is:

1. An electroluminescent device comprising:
   a substrate;
   an anode on the substrate;
   a luminescent layer on a side of the anode facing away from the substrate; and
   a cathode on a side of the luminescent layer facing away from the substrate, the cathode comprising:
   a transflective layer on the side of the luminescent layer facing away from the substrate; and
   a light-emission enhancement layer on a side of the transflective layer facing away from the substrate,
   wherein the anode is configured to reflect light incident thereon, a material of the transflective layer comprises metal, and the transflective layer is configured to transmit a first portion of light incident thereon and to reflect a second portion of the light incident thereon, and
   wherein the cathode further comprises an electrode layer between the transflective layer and the light-emission enhancement layer,
   wherein a thickness of the electrode layer is determined according to a design resistance value of the cathode, a thickness of the transflective layer, and a thickness of the light-emission enhancement layer.

2. The electroluminescent device according to claim 1, wherein the material of the transflective layer comprises a magnesium-silver alloy.

3. The electroluminescent device according to claim 1, wherein a thickness of the light-emission enhancement layer is related to a material of the luminescent layer.

4. The electroluminescent device according to claim 3, wherein:
   the luminescent layer is a luminescent layer that emits red light, and the thickness of the light-emission enhancement layer is in a range of 110 nm to 120 nm; or
   the luminescent layer is a luminescent layer that emits green light, and the thickness of the light-emission enhancement layer is in a range of 90 nm to 100 nm; or
   the luminescent layer is a luminescent layer that emits blue light, and the thickness of the light-emission enhancement layer is in a range of 80 nm to 90 nm.

5. The electroluminescent device according to claim 1, wherein a material of the light-emission enhancement layer comprises a transparent oxide.

6. The electroluminescent device according to claim 1, wherein the transflective layer has a thickness greater than 8 nm.

7. The electroluminescent device according to claim 1, wherein an orthographic projection of each of the anode, the transflective layer and the light-emission enhancement layer on the substrate covers an orthographic projection of the luminescent layer on the substrate.

8. The electroluminescent device according to claim 1, wherein the electrode layer comprises the same material as the light-emission enhancement layer.

9. The electroluminescent device according to claim 8, wherein a material of the electrode layer comprises a transparent oxide.

10. The electroluminescent device according to claim 1, wherein the anode comprises:
    a conductive anode layer on the substrate; and
    a reflective layer between the conductive anode layer and the substrate.

11. The electroluminescent device according to claim 10, wherein a material of the reflective layer comprises silver.

12. The electroluminescent device according to claim 1, wherein the luminescent layer comprises an organic electroluminescent material.

13. A display panel comprising the electroluminescent device according to claim 1.

14. A display apparatus comprising the display panel according to claim 13.

* * * * *